United States Patent
Blaesing-Bangert et al.

(10) Patent No.: US 6,441,899 B1
(45) Date of Patent: Aug. 27, 2002

(54) APPARATUS AND METHOD FOR LOADING SUBSTRATES OF VARIOUS SIZES INTO SUBSTRATE HOLDERS

(75) Inventors: Carola Blaesing-Bangert, Huettenberg; Ulrich Kaczynski, Bad Nauheim, both of (DE)

(73) Assignee: Leica Microsystems Wetzlar GmbH, Wetzlar (DE)

( * ) Notice: Subject to any disclaimer, the term of this patent is extended or adjusted under 35 U.S.C. 154(b) by 42 days.

(21) Appl. No.: 09/685,087

(22) Filed: Oct. 11, 2000

(30) Foreign Application Priority Data

Oct. 11, 1999 (DE) .......................................... 199 49 008

(51) Int. Cl.[7] .............................................. G01N 21/01
(52) U.S. Cl. ...................................... 356/244; 356/440
(58) Field of Search .............................. 356/244, 440, 356/399, 400, 401, 614

(56) References Cited

U.S. PATENT DOCUMENTS 5,786,897 A    7/1998  Ototake
5,999,254 A  * 12/1999  Seibert et al. ............... 356/244
6,323,953 B1 * 11/2001  Blaesing-Bangert et al. ..... 250/559.29

* cited by examiner

Primary Examiner—Frank G. Font
Assistant Examiner—Roy M. Punnoose
(74) Attorney, Agent, or Firm—Crowell & Moring LLP

(57) ABSTRACT

An apparatus and method for loading substrates of various sizes into a substrate holder. The apparatus for this purpose comprises a base plate with peripheral rim and at least three support means arranged on the base plate, each of which has configured on it different support surfaces for the various substrates. The support surfaces are arranged in stepped fashion on the support means. In addition, receiving elements for the substrate holder are arranged on the base plate in such a way that the substrate holder that is set in place surrounds the support means and is aligned and oriented in terms of its position. At least one sensor element is housed in at least one of the support surfaces of a support means for one substrate size, so as thereby to detect the size of the substrate.

16 Claims, 3 Drawing Sheets

APPARATUS AND METHOD FOR LOADING SUBSTRATES OF VARIOUS SIZES INTO SUBSTRATE HOLDERS

CROSS REFERENCE TO RELATED APPLICATIONS

This invention claims priority of a German filed patent application DE 199 49 008.2.

FIELD OF THE INVENTION

The invention concerns an apparatus for loading substrates of various sizes into substrate holders.

The invention furthermore concerns a method for loading substrates of various sizes into a substrate holder provided therefor.

BACKGROUND OF THE INVENTION

In critical-distance (CD) measurement systems that are set up for transmitted-light measurements, the substrates are transported in frames. In this context the masks are usually introduced into the frames by hand and outside the measurement system. The frames with the introduced substrates are then directly loaded onto and unloaded from the measurement stage (X-Y carriage). This is not practical for use in the production environment of semiconductor manufacturers. The substrate handling system used in the Leica® LMS IPRO of Leica Microsystems Wetzlar GmbH is automated, but is not designed for large substrates or for different substrate holders.

SUMMARY OF THE INVENTION

It is therefore the object of the invention to create an apparatus which makes possible reliable introduction of various substrates into a measuring instrument. Reliable transfer of the substrates into the measuring instrument is of particular importance in this context. In addition, it is intended by way of the apparatus to prevent damage to the substrates due to mishandling of the substrate holders.

This object is achieved according to the present invention, in an apparatus of the kind cited initially, in that a base plate with peripheral rim is provided. Arranged on the base plate are at least three support means, each of which has configured on it different support surfaces for the various substrates. The support surfaces are arranged in stepped fashion on the support means. Receiving elements, which support the transport frame in such a way that it surrounds the support means and is aligned in terms of its position, are provided for the substrate holders.

A further object of the invention is to create a method which makes possible the delivery of various substrates into a measuring instrument. An additional object is to guarantee reliable and damage-free handling of the various substrates.

This object is achieved according to the present invention, in a method of the kind cited initially, in that the method comprises the following steps:

determining the type of substrate holder;

depositing the substrate holder onto the support means provided on a base plate of the apparatus;

placing a substrate onto support means provided therefor;

determining the size of the substrate;

checking conformity between the substrate holder and substrate; and transferring the substrate into the substrate holder provided for the substrate.

Advantageous developments are evident from the features of the dependent claims.

With the configuration according to the present invention of a loading station for introducing the various substrates into a substrate holder, it becomes possible to accomplish reliable or automated handling of the individual substrates. In addition, placement of the substrates in the substrate holders means that the substrates arrive already aligned and thus in a defined position. The advantage of this is that defined conditions can be assumed when measuring the substrates. The substrates are transferred into the measuring instrument together with the substrate holders. This offers the advantage that the substrate itself does not need to be introduced by hand by an operator into the measuring instrument. This prevents temperature gradients in the substrate that might result by being manually grasped.

BRIEF DESCRIPTION OF THE DRAWINGS

The subject matter of the invention is depicted schematically in the drawings and will be described below with reference to the Figures, in which.

DETAILED DESCRIPTION OF THE INVENTION

Figure 1:
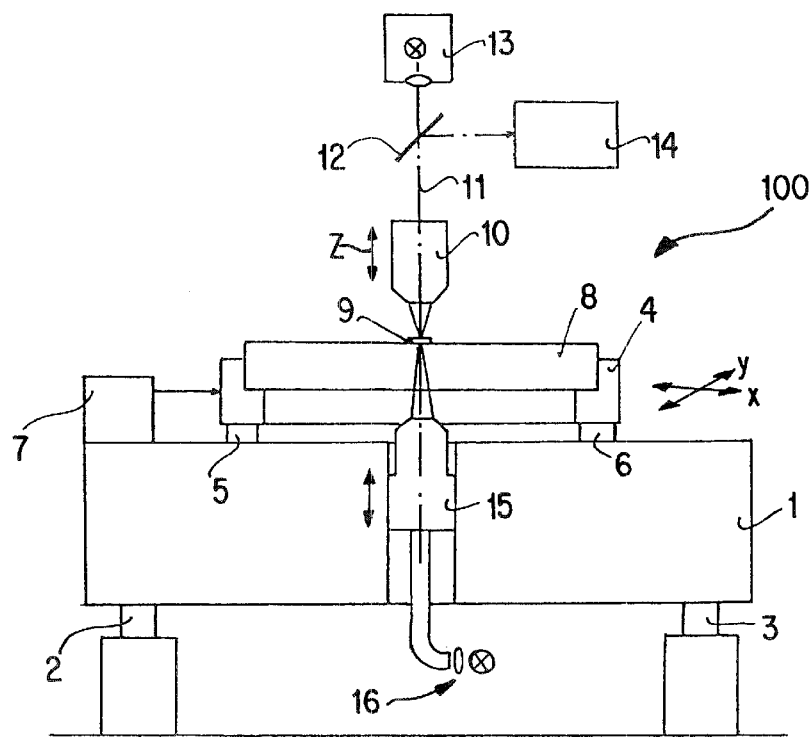
FIG. 1 shows a schematic side view of a measuring instrument.

The high-precision measuring instrument 100 depicted in FIG. 1 comprises a granite block 1 that is mounted in vibration-damped fashion on bases 2, 3. On granite block 1, an X-Y carriage 4 configured as a frame is slidingly displaceable on air bearings 5, 6 in the two directions indicated by arrows. The frame of X-Y carriage 4 is preferably made of a glass ceramic with a low coefficient of thermal expansion. The drive systems for it are not depicted. The position of X-Y carriage is measured in the X and Y directions with a laser interferometer system 7.

A substrate 8 is introduced into the frame of X-Y carriage 4. Substrate 8 is made, for example, of quartz glass. Patterns 9 are present on the substrate surface. Since X-Y carriage 4 is configured as a frame, substrate 8 can also be transilluminated from below. For substrates that are opaque, incident illumination is then used. The description hereinafter is limited to the illumination of light-transmissive substrates. This is not to be construed in any way as a limitation of the invention.

Located above substrate 8 is an imaging system 10 of high optical quality that is adjustable in the Z direction along its optical axis 11 for focusing. By way of a beam-splitter mirror 12, on the one hand the light of a light source 13 is introduced into the optical beam path, and on the other hand the imaging beams are directed onto a detector device 14. Detector device 14 is, for example, a CCD camera having a high-resolution pixel array. Light source 13 emits in the near UV spectral region.

Set into granite block 1 is a further illumination device that comprises an adjustable-height condenser 15 and a light source 16. The exit surface of a light guide can also be provided as light source 16. The optical axis of condenser 15 is aligned with optical axis 11 of imaging system 10. The height adjustment of condenser 15 with light source 16 is used to adapt the illumination beams being directed onto pattern 9 to different optical thicknesses of substrates 8. The condenser head can, in particular, extend into the open part of the frame of X-Y carriage 4. In order to prevent damage during stage displacements over the entire substrate surface, it can be pulled beneath the surface of granite block 1. Light sources 13 and 16 can be activated independently of one another.

Figure 2:
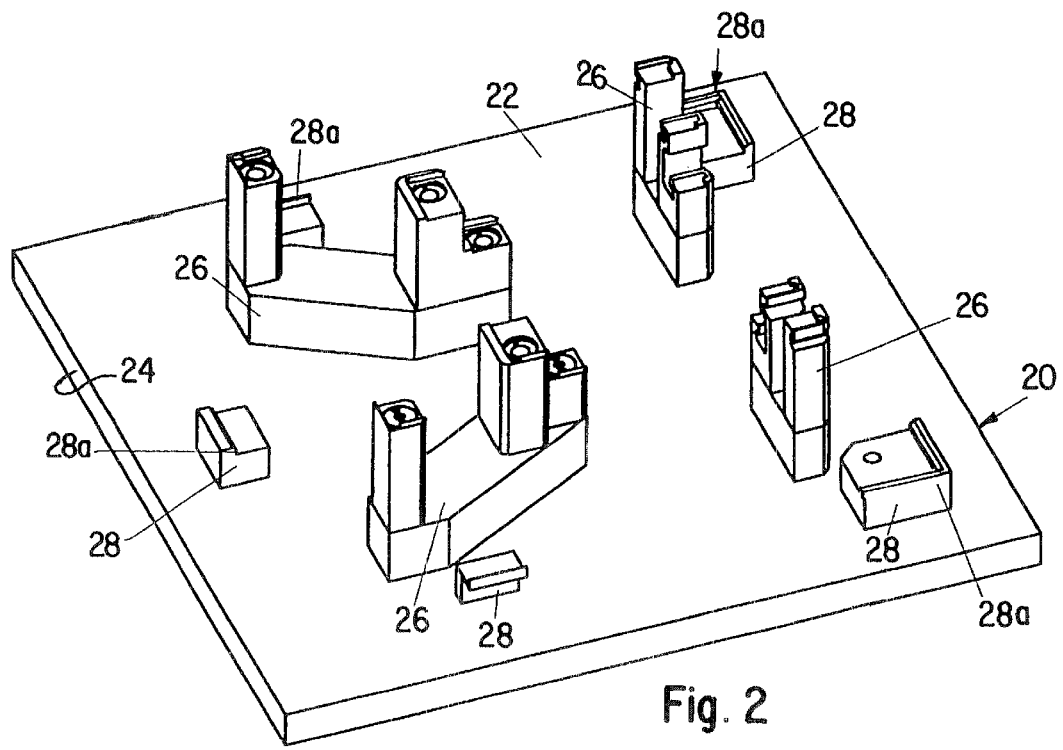
FIG. 2 shows a perspective depiction of a loading station.
Figure 3:
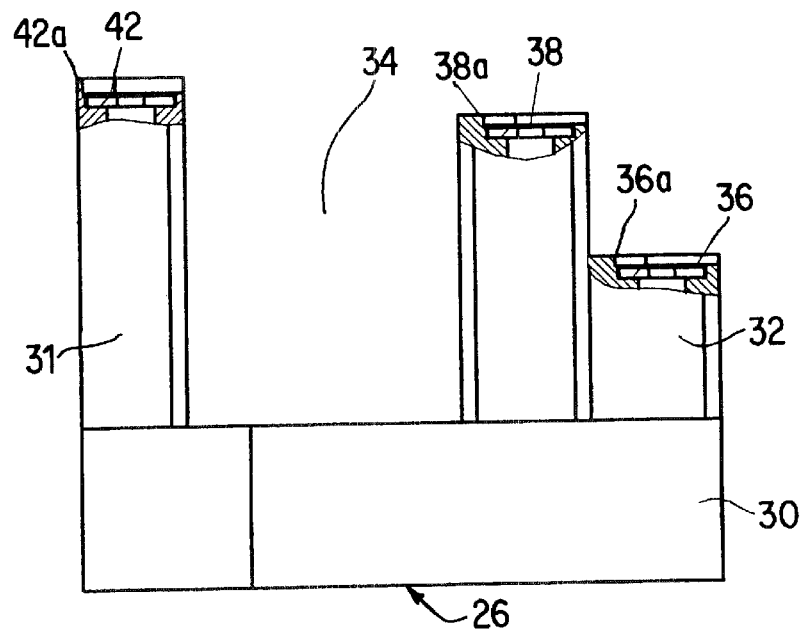
FIG. 3 shows a side view of a support means.

FIG. 2 shows a perspective depiction of loading station 20. Loading station 20 has a base plate 22 on which a peripheral rim 24 is configured. Arranged on base plate 22 are multiple support means 26 which are distributed on base plate 22 in such a way as to guarantee a stable support for substrates 8. In the present case, four support elements 26 are provided. It is also conceivable for only three support means 26 to be provided, which are then arranged in such a way as to guarantee a stable and secure support for substrates 8. Also mounted on base plate 22 in addition to support means 26 are receiving elements 28 which support a substrate holder 50 (see FIG. 5) in such a way that it surrounds support means 26 and is aligned and oriented in terms of its position. For that purpose, stop edges 28*a* which ensure a defined and precise position for substrate holder 50 are configured on several receiving elements 28. In the present exemplary embodiment, receiving elements 28 are arranged on base plate 22 in such a way that they lie closer than support means 26 to rim 24. FIG. 3 shows a side view of an exemplary embodiment of a support means 26 along section A—A of FIG. 4. Support means 26 can be produced in one piece from a suitable material. In the present exemplary embodiment, support means 26 is assembled from multiple individual components. A base part 30 carries a first part 31 and second part 32. First part 31 and second part 32 are physically separated from one another by an opening 34. In FIG. 3, a first and second support surface 36 and 38 are configured on second part 32 of support means 26. A third support-surface 42 is configured on first part 31 of support means 26. Support means 26 are physically arranged on base plate 22 in such a way that the same support surfaces 36, 38, 40 [sic], or 42 of the various support means 26 represent a stable retainer for each of the various substrate sizes. To delimit first support surface 36, a first stop edge 36a is configured thereon. To delimit second support surface 38, a second stop edge 38*a* is configured thereon. To delimit third support surface 42, a third stop edge 40*a* is configured thereon. To delimit fourth support surface 42, a fourth stop edge 42*a* is configured thereon. Substrates that can be measured with this apparatus must conform to the SEMI standard (SEMI P1-92© SEMI 1981, 1989). A few examples thereof are quartz masks of type 6025 (6×6 inches and 0.25 inches thick) or type 5009 (5×5 inches and 0.09 inches thick), or quartz masks with dimensions 230×230×9 mm.

Figure 4:
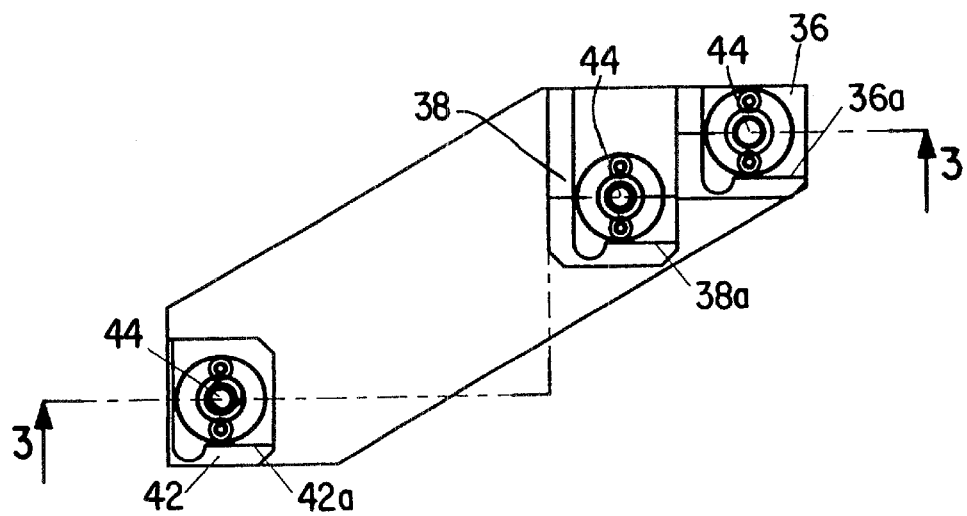
FIG. 4 shows a plan view of the various support surfaces of the support means.
Figure 5:
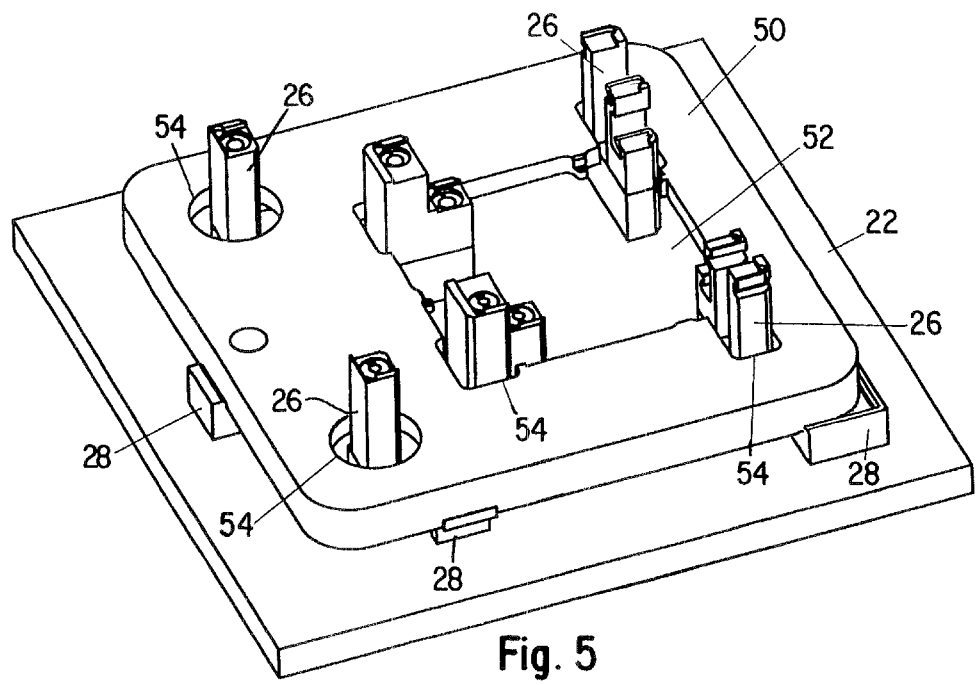
FIG. 5 shows a perspective depiction of a substrate holder introduced into the loading station.

A plan view of the various support surfaces 36, 38, and 42 of support means 26 is depicted in FIG. 4. In the exemplary embodiment depicted here, all stop edges 36*a*, 38*a*, and 42*b* are of angled configuration in order to hold substrate 8 in a stable position. Other embodiments of stop edges 36*a*, 38*a*, and 42*b* are conceivable and obvious. Housed in each of support surfaces 36, 38, and 42 is a sensor element 44 that determines whether a substrate 8, and which one, has been introduced into loading station 20. Sensor elements 44 do not need to be provided on the various support surfaces 36, 38, and 42 of an individual support element 26. It is also conceivable for each support means 26 to contain a sensor element 44 that is always installed on a different support surface. Assuming, for example, that there are four support means, then in the case of first support means 26 sensor element 44 is located in first support surface 36, in the case of second support means 26 in second support surface, and in the case of third support means 26 in third support surface 42. Any other arrangement of sensor elements 44 that allows a determination as to whether a substrate has been introduced is equally possible. Sensor elements 44 themselves can have different configurations, for example a contact switch, a capacitative sensor, or an optical sensor.

Before substrate 8 is introduced into loading station 20, a substrate holder 50 is delivered into loading station 20 (FIG. 4). An opening 52 that is determined in accordance with the length and width of substrates 8 that are used is defined in substrate holder 50. Additionally provided in substrate holder 50 are guide openings 54 which are arranged in substrate holder 50 in such a way that they correspond to the physical arrangement of support means 26 on base plate 22. When substrate holder 50 is placed into loading station 20, parts of support means 26 engage into guide openings 54 of substrate holder 50 and thereby ensure approximate guidance. Guide openings 54 are dimensioned such that a clearance exists between them and support means 26. Once substrate holder 50 has been inserted into loading station 20, it then rests on receiving elements 28, by which it is exactly aligned and positioned.

Figure 6:
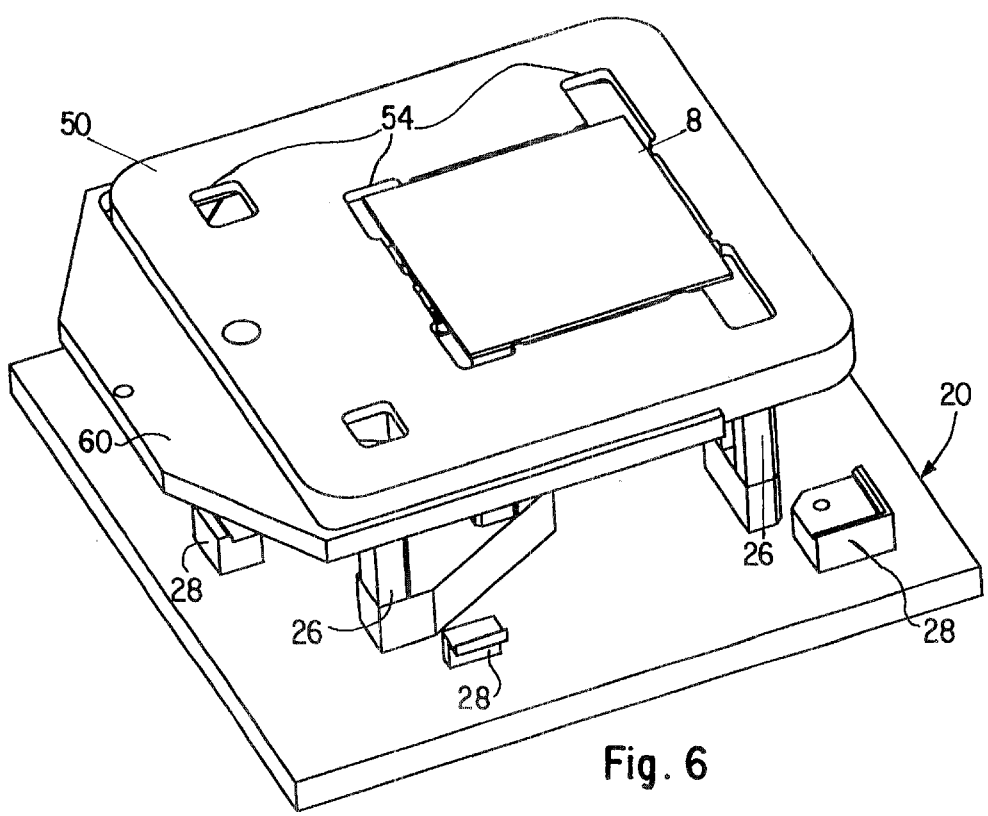
FIG. 6 shows a perspective depiction in which the substrate holder, together with the substrate, is lifted away from the loading station.

FIG. 6 illustrates the lifting of substrate holder 50 together with an introduced substrate 8. If, as already mentioned above, the substrate 8 suitable for substrate holder 50 has been identified by sensor elements 44 (FIG. 4), substrate holder 50 can be lifted away from loading station 20. For this purpose, a fork 60, which is mounted on a robot arm (not depicted), moves beneath substrate holder 50 which is resting on receiving elements 28. As a result of the lifting movement of the robot arm (not depicted), fork 60 raises substrate holder 50, which thereby takes with it substrate 8 that is present in loading station 20. Substrate 8 comes to rest in opening 52 of substrate holder 50. The lifting movement of the robot arm (not depicted) also causes support means 26 of loading station 20 to be moved out of guide openings 54 of substrate holder 50. The unit of substrate holder 50 plus substrate 8 can now be transferred by robot arm [sic] 60 into high-precision measuring instrument 100 or into a magazine (not depicted).

The present invention was described with reference to exemplary embodiments. It is nevertheless apparent to any person skilled in this art that changes and modifications can be made without thereby leaving the range of protection of the claims recited below.

| PARTS LIST | | | |
|---|---|---|---|
| 1 | Granite block | 26a | Inner surface |
| 2 | Base | 26a | Outer surface |
| 3 | Base | 28 | Receiving elements |
| 4 | X-Y carriage | 28a | Stop edges |
| 5 | Air bearing | 30 | Base part |
| 6 | Air bearing | 31 | First part |
| 7 | Laser interferometer | 32 | Second part |
| 8 | Substrate | 34 | Opening |
| 9 | Patterns | 36 | First support surface |
| 10 | Imaging system | 36a | First stop edge |

-continued

PARTS LIST

| 11 | Optical axis | 38 | Second support surface |
| 12 | Beam-splitter mirror | 38a | Second stop edge |
| 13 | Light source | 42 | Third support surface |
| 14 | Detector device | 42a | Third stop edge |
| 15 | Adjustable-height condenser | 44 | Sensor element |
| 16 | Light source | 50 | Substrate holder |
| 20 | Loading station | 52 | Opening |
| 22 | Base plate | 54 | Guide openings |
| 24 | Rim | 60 | Fork |
| 26 | Support means | | |

What is claimed is:

1. An apparatus for loading substrates (8) of various sizes into a substrate holder (50), characterized by
   a) a base plate (22) with peripheral rim (24);
   b) at least three support means (26) arranged on the base plate (22), each of which has configured on it different support surfaces (36, 38, and 42) for the various substrates (8), the support surfaces (36, 38, and 42) being arranged in stepped fashion on the support means (26); and
   c) receiving elements (28) for the substrate holder (50) which support the substrate holder (50) in such a way that it surrounds the support means (26) and is aligned in terms of its position.

2. The apparatus as defined in claim 1, wherein the support surfaces (36, 38, 40, and 42) are delimited by stops (36a, 38a, and 42a) in such a way that the various substrates (8) are oriented.

3. The apparatus as defined in claim 1, wherein at least one sensor element (44) is housed in at least one of the support surfaces (36, 38, 40, and 42) of a support means (26) for one substrate size.

4. The apparatus as defined in claim 3, wherein the sensor element (44) is designed as a contact switch.

5. The apparatus as defined in claim 3, wherein the sensor element (44) is designed as a capacitive sensor.

6. The apparatus as defined in claim 3, wherein the sensor element (44) is designed as an optical sensor.

7. The apparatus as defined in claim 1, wherein at least one further sensor element is provided, such that in the case of substrates of identical size, their differing thicknesses are detectable.

8. The apparatus as defined in claim 1, wherein the substrate holders (50) for the various substrate sizes have identical outside dimensions.

9. A method for loading substrates of various sizes into a substrate holder (50) provided therefor, characterized by the following steps:
   a) determining the type of substrate holder (50);
   b) depositing the substrate holder (50) onto the support means (26) provided on a base plate (22) of the apparatus;
   c) placing a substrate onto support means (26) provided therefor;
   d) determining the size of the substrate (8);
   e) checking conformity between the substrate holder (50) and substrate (8); and
   f) transferring the substrate into the substrate holder (50) provided for the substrate.

10. The method as defined in claim 9, wherein placement of the substrate (8) into the support means (26) provided therefor is accomplished manually by an operator.

11. The method as defined in claim 9, wherein placement of the substrate (8) into the support means (26) provided therefor is accomplished by an automated apparatus.

12. The method as defined in claim 9, wherein the step of determining the type of substrate holder (50) is accomplished by way of a code that is provided on the substrate holder (50).

13. The method as defined in claim 9, wherein the step of determining the substrate type (8) is accomplished by way of sensor elements (44) that are provided in the support surfaces of the support means.

14. The method as defined in claim 13, wherein the sensor elements (44) are designed as contact switches.

15. The method as defined in claim 13, wherein the sensor elements (44) are designed as capacitive sensors.

16. The method as defined in claim 13, wherein the sensor elements (44) are designed as an optical sensor.

* * * * *